US011394817B2

(12) United States Patent
Shinozaki et al.

(10) Patent No.: US 11,394,817 B2
(45) Date of Patent: Jul. 19, 2022

(54) RADIO FREQUENCY MODULE AND COMMUNICATION DEVICE

(71) Applicant: Murata Manufacturing Co., Ltd., Nagaokakyo (JP)

(72) Inventors: Takayuki Shinozaki, Nagaokakyo (JP); Yoichi Sawada, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

(21) Appl. No.: 17/020,812

(22) Filed: Sep. 15, 2020

(65) Prior Publication Data

US 2021/0092213 A1 Mar. 25, 2021

(30) Foreign Application Priority Data

Sep. 20, 2019 (JP) .............................. JP2019-171745

(51) Int. Cl.
*H04M 1/02* (2006.01)
*H03F 3/24* (2006.01)
*H03F 1/56* (2006.01)

(52) U.S. Cl.
CPC ............ *H04M 1/0277* (2013.01); *H03F 1/56* (2013.01); *H03F 3/245* (2013.01); *H03F 2200/171* (2013.01); *H03F 2200/222* (2013.01); *H03F 2200/387* (2013.01); *H03F 2200/451* (2013.01)

(58) Field of Classification Search
CPC combination set(s) only.
See application file for complete search history.

(56) References Cited

U.S. PATENT DOCUMENTS

| | | | | |
|---|---|---|---|---|
| 2009/0115668 A1* | 5/2009 | Abe | ........................ | H01Q 1/243 343/702 |
| 2010/0157860 A1* | 6/2010 | Hagiwara | ............ | H04B 1/0057 370/310 |
| 2017/0301653 A1* | 10/2017 | Frenette | .................. | H01L 23/66 |
| 2017/0301654 A1* | 10/2017 | Frenette | .................. | H01L 25/50 |
| 2018/0131501 A1 | 5/2018 | Little | | |
| 2018/0261566 A1* | 9/2018 | Babcock | ................. | H01L 23/66 |
| 2018/0286840 A1* | 10/2018 | Nair | ........................ | H01L 24/20 |

(Continued)

FOREIGN PATENT DOCUMENTS

JP 2018-181943 A 11/2018

OTHER PUBLICATIONS

Korean Korean Office Action dated Oct. 1, 2021 in Korean Application No. 10-2020-0116498.

*Primary Examiner* — Junpeng Chen
(74) *Attorney, Agent, or Firm* — Xsensus LLP

(57) ABSTRACT

A radio frequency module includes: a module board including a first principal surface and a second principal surface on opposite sides of the module board, a transmission input terminal, an antenna connection terminal, and a transmission power amplifier. At least one of one or more first circuit components that are disposed on a transmission input path connecting the transmission input terminal and the transmission power amplifier is mounted on the first principal surface, and at least one of one or more second circuit components that are disposed on a first transmission output path or a second transmission output path each connecting an output terminal of the transmission power amplifier and the antenna connection terminal is mounted on the second principal surface.

12 Claims, 3 Drawing Sheets

(56) References Cited

U.S. PATENT DOCUMENTS

2019/0214355 A1    7/2019  Nishikawa
2019/0238169 A1    8/2019  Naniwa et al.
2019/0364658 A1*  11/2019  Ammar ................ H05K 1/0209
2020/0359507 A1*  11/2020  Chikita ............... H01L 23/5384

* cited by examiner

RADIO FREQUENCY MODULE AND COMMUNICATION DEVICE

CROSS REFERENCE TO RELATED APPLICATION

The present application is based on and claims priority to Japanese Patent Application No. 2019-171745 filed on Sep. 20, 2019. The entire disclosure of the above-identified application, including the specification, drawings and claims is incorporated herein by reference in its entirety.

TECHNICAL FIELD

The present disclosure relates to a radio frequency module and a communication device.

BACKGROUND

In mobile communication devices such as a mobile phone, the arrangement configuration of circuit elements included in radio frequency (RF) front-end circuits is becoming complex, particularly with developments in multiband technologies.

US Patent Application Publication No. US 2018/0131501 A1 discloses a configuration of a front-end circuit including two transmission power amplifiers for executing carrier aggregation (CA) using a plurality of communication bands (frequency bands). The front-end circuit includes a switch on the input side of two transmission power amplifiers. The switch switches between inputting transmission signals from two transceiver circuits to one of the two transmission power amplifiers and inputting the transmission signals to the other of the two transmission power amplifiers. According to this configuration, two transmission signals output from the above-described two transceiver circuits can be transmitted with high isolation from two antennas via the above-described front-end circuit.

SUMMARY

Technical Problems

However, as recognized by the present inventor, when the front-end circuit disclosed by US Patent Application Publication No. US 2018/0131501 A1 is configured in a single module as a small-sized front-end circuit, it is expected that electric field coupling, magnetic field coupling, or electromagnetic field coupling occurs between a radio frequency component (e.g., the above-described switch) disposed on the input side of the transmission power amplifier and a radio frequency component disposed on the output side of the transmission power amplifier. In this case, the transmission power amplifier oscillates as a result of formation of an unnecessary feedback loop that transfers a radio frequency signal in the transmission power amplifier, and there arises a problem that the operation of the transmission power amplifier becomes unstable.

The present disclosure addresses the above-described and other problems, and is to provide a radio frequency module and a communication device that reduce unstable operations of the transmission power amplifier.

Solutions

In order to provide such a radio frequency module and such a communication device, a radio frequency module according to one aspect of the present disclosure includes a module board including a first principal surface, a second principal surface on opposite sides of the module board, a transmission input terminal, and an antenna connection terminal; a transmission power amplifier disposed on the module board and connected to the transmission input terminal; one or more first circuit components disposed on a transmission input path that is a signal path connecting the transmission input terminal and an input terminal of the transmission power amplifier; and one or more second circuit components disposed on a transmission output path that is a signal path connecting an output terminal of the transmission power amplifier and the antenna connection terminal. In the above-described radio frequency module, at least one of the one or more first circuit components is mounted on the first principal surface, and at least one of the one or more second circuit components is mounted on the second principal surface.

Advantageous Effects

According to the present disclosure, it is possible to provide a radio frequency module and a communication device that reduce unstable operations of a power amplifier.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
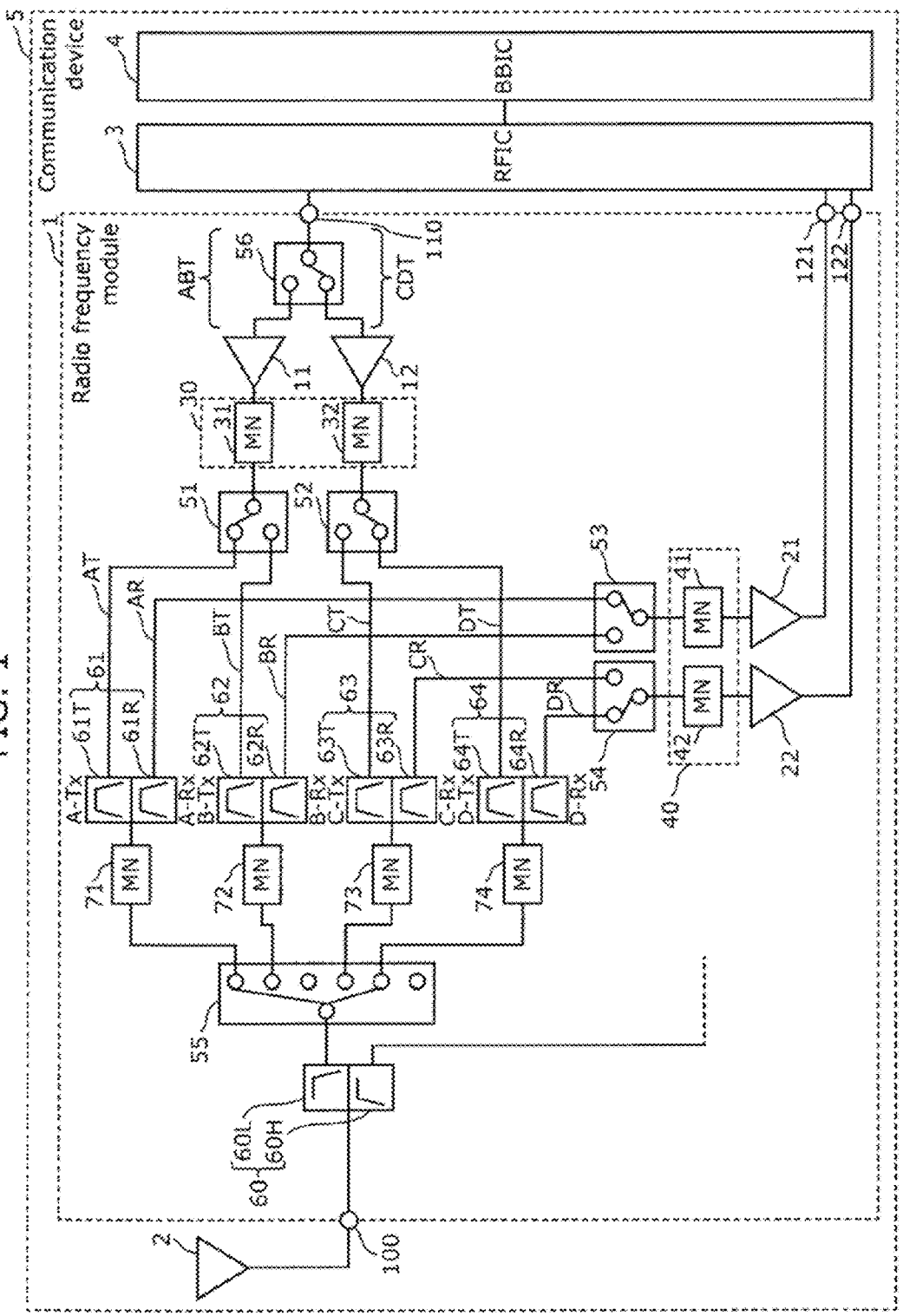
FIG. 1 illustrates a circuit configuration of a radio frequency module (or RF front-end circuitry) according to an embodiment.

The following describes in detail an embodiment of the present disclosure. The embodiment described below illustrates a general or specific example. The numerical values, shapes, materials, structural components, the arrangement and connection of the structural components, and so on, illustrated in the following embodiment are mere examples, and are therefore not intended to limit the present disclosure. Among the structural components in the following working examples and variations, structural components not recited in the independent claims will be described as arbitrary structural components. In addition, the sizes of structural components and the ratios of the sizes in the drawings are not necessarily strictly illustrated. In each of the diagrams, substantially the same structural components are denoted by the same reference signs, and redundant description may be omitted or simplified.

In addition, in the following description, terms indicating relationships between components such as parallel and vertical and terms indicating the shapes of components such as a quadrilateral shape, and numerical ranges do not represent only the strict meanings but include also a substantially equivalent range, such as a difference of approximately several percent.

In addition, in the following description, in A, B, and C mounted on a board, "in a plan view of the board (or the principal surface of the board), C is disposed between A and B" means that a straight line connecting an arbitrary point in A and an arbitrary point in B passes through a region in C in a plan view of the board. Furthermore, a plan view of the board means that the board and circuit elements mounted on the board are orthographically projected on a plane parallel to the board.

In addition, in the following description, a "transmission path" refers to a transfer path including a line through which a radio frequency transmission signal propagates, an electrode directly connected to the line, a terminal directly connected to the line or the electrode, etc. Furthermore, a "transmission input path" refers to a transfer path including a line through which a radio frequency transmission signal propagates in the input-side of the transmission power amplifier, an electrode directly connected to the line, a terminal directly connected to the line or the electrode, etc. Furthermore, a "transmission output path" refers to a transfer path including a line through which a radio frequency transmission signal propagates in the output-side of the transmission power amplifier, an electrode directly connected to the line, a terminal directly connected to the line or the electrode, etc. Furthermore, a "reception path" refers to a transfer path including a line through which a radio frequency reception signal propagates, an electrode directly connected to the line, a terminal directly connected to the line or the electrode, etc. Furthermore, a "signal path" refers to a transfer path including a line through which a radio frequency signal propagates, an electrode directly connected to the line, a terminal directly connected to the line or the electrode, etc. Furthermore, as used herein the terms "circuit" or "circuitry" means one or more circuits, including discrete circuit(s) as well as circuit board(s) and combinations thereof.

Embodiment

1. Circuit Configuration of Radio Frequency Module 1 and Communication Device 5

FIG. 1 illustrates a circuit configuration of radio frequency module 1 according to an embodiment. As illustrated in FIG. 1, communication device 5 includes radio frequency module 1, antenna 2, radio frequency (RF) signal processing circuit (RF integrated circuit (IC)) 3, and baseband signal processing circuit (BBIC) 4. In this exemplary configuration the communication device is a multi-band transceiver. As used in this specification the term "module", as used with "radio frequency module", or "RF front-end module" should be construed as circuitry (programmable, as well as discrete) and associated circuit components, such as circuit boards, RF shielding, etc.

RFIC 3 is an RF signal processing circuit that processes a radio frequency signal to be transmitted by antenna 2 or a radio frequency signal received by antenna 2. More specifically, RFIC 3 performs signal processing, by down-conversion or the like, on a reception signal that has been input via the reception path of radio frequency module 1, and outputs the reception signal generated by the signal processing to BBIC 4. In addition, RFIC 3 performs signal processing, by up-conversion or the like, on a transmission signal that has been input from BBIC 4, and outputs the transmission signal generated by the signal processing to the transmission path of radio frequency module 1.

BBIC 4 is a circuit that performs signal processing using an intermediate frequency band having a lower frequency than a frequency band of a radio frequency signal that is transferred through radio frequency module 1. The signal processed by BBIC 4 is, for example, used as an image signal for image display or as a sound signal for telephone conversation via a speaker.

RFIC 3 also has a function as a controller that controls the connection of switches 51, 52, 53, 54, 55 and 56 included in radio frequency module 1, based on a communication band (frequency band) used. More specifically, RFIC 3 switches connection among switches 51 to 56 included in radio frequency module 1, by a control signal (not illustrated). It should be noted that the controller may be disposed outside RFIC 3, and may be disposed, for example, in radio frequency module 1 or BBIC 4. Moreover, in one example the controller is a remote computer, or a distributed computer system that communicates with the radio frequency module 1 via a wireless or wired connection. Likewise, in another example, the controller is a local controller with a user interface that converts input signals into control commands that control the communication device 5 as well as subcomponents, such as the RF module 1.

Antenna 2 is connected to antenna connection terminal 100 of radio frequency module 1. Antenna 2 emits a radio frequency signal that has been output from radio frequency module 1, or receives a radio frequency signal from the outside and outputs the radio frequency signal to radio frequency module 1.

It should be noted that, in communication device 5 according to the present embodiment, antenna 2 and BBIC 4 are not indispensable components.

Next, a detailed configuration of radio frequency module 1 will be described.

As illustrated in FIG. 1, radio frequency module 1 includes: antenna connection terminal 100; transmission power amplifiers 11 and 12; reception low noise amplifiers (LNAs) 21 and 22; transmission filters 61T, 62T, 63T, and 64T; reception filters 61R, 62R, 63R, and 64R; transmission output matching circuit 30; reception input matching circuit 40; matching circuits 71, 72, 73, and 74; switches 51, 52, 53, 54, 55, and 56; and diplexer 60.

Antenna connection terminal 100 is a common antenna terminal connected to antenna 2.

Transmission power amplifier 11 is an amplifier that amplifies radio frequency signals of communication band A (a first communication band) and communication band B (a second communication band) that belong to a first frequency band group, which have been input from transmission input terminal 110. In addition, transmission power amplifier 12 is an amplifier that amplifies radio frequency signals of communication band C and communication band D that belong to a second frequency band group different from the first frequency band group, which have been input from transmission input terminal 110.

Reception low noise amplifier 21 is an amplifier that amplifies radio frequency signals of communication band A and communication band B with low noise, and outputs the amplified radio frequency signals to reception output terminal 121. Reception low noise amplifier 22 is an amplifier that amplifies radio frequency signals of communication band C and communication band D with low noise, and outputs the amplified radio frequency signals to reception output terminal 122.

Transmission input path ABT is one example of the transmission input path, through which transmission signals of communication bands A and B are transferred. Transmission input path ABT has one end connected to transmission input terminal 110, and the other end connected to an input terminal of transmission power amplifier 11. As such, through transmission input path ABT, a transmission signal that has been input from transmission input terminal 110 is transferred to transmission power amplifier 11. Transmission input path CDT is one example of the transmission input path, through which transmission signals of communication bands C and D are transferred. Transmission input path CDT has one end connected to transmission input terminal 110, and the other end connected to an input terminal of transmission power amplifier 12. As such, through transmission input path CDT, a transmission signal that has been input from transmission input terminal 110 is transferred to transmission power amplifier 12.

Transmission output path AT is one example of a first transmission output path, through which a transmission signal of communication band A is transferred. Transmission output path AT has one end connected to an output terminal of transmission power amplifier 11, and the other end connected to antenna connection terminal 100. Transmission output path BT is one example of a second transmission output path, through which a transmission signal of communication band B is transferred. Transmission output path BT has one end connected to an output terminal of transmission power amplifier 11, and the other end connected to antenna connection terminal 100. Transmission output path CT is one example of the first transmission output path, through which a transmission signal of communication band C is transferred. Transmission output path CT has one end connected to an output terminal of transmission power amplifier 12, and the other end connected to antenna connection terminal 100. Transmission output path DT is one example of the second transmission output path, through which a transmission signal of communication band D is transferred. Transmission output path DT has one end connected to an output terminal of transmission power amplifier 12, and the other end connected to antenna connection terminal 100.

Reception path AR is one example of a first reception path, through which a reception signal of communication band A is transferred. Reception path AR has one end connected to antenna connection terminal 100, and the other end connected to reception low noise amplifier 21. Reception path BR is one example of a second reception path, through which a reception signal of communication band B is transferred. Reception path BR has one end connected to antenna connection terminal 100, and the other end connected to reception low noise amplifier 21. Through reception path CR, a reception signal of communication band C is transferred. Reception path CR has one end connected to antenna connection terminal 100, and the other end connected to reception low noise amplifier 22. Through reception path DR, a reception signal of communication band D is transferred. Reception path DR has one end connected to antenna connection terminal 100, and the other end connected to reception low noise amplifier 22.

Transmission filter 61T is disposed on transmission output path AT that connects transmission power amplifier 11 and antenna connection terminal 100. Transmission filter 61T passes a transmission signal in a transmission band of communication band A, among the transmission signals that have been amplified by transmission power amplifier 11. Transmission filter 62T is disposed on transmission output path BT that connects transmission power amplifier 11 and antenna connection terminal 100. Transmission filter 62T passes a transmission signal in a transmission band of communication band B, among the transmission signals that have been amplified by transmission power amplifier 11. Transmission filter 63T is disposed on transmission output path CT that connects transmission power amplifier 12 and antenna connection terminal 100. Transmission filter 63T passes a transmission signal in a transmission band of communication band C, among the transmission signals that have been amplified by transmission power amplifier 12. Transmission filter 64T is disposed on transmission output path DT that connects transmission power amplifier 12 and antenna connection terminal 100. Transmission filter 64T passes a transmission signal in a transmission band of communication band D, among the transmission signals that have been amplified by transmission power amplifier 12.

Reception filter 61R is disposed on reception path AR that connects reception low noise amplifier 21 and antenna connection terminal 100. Reception filter 61R passes a reception signal in a reception band of communication band A, among the reception signals that have been input from antenna connection terminal 100. Reception filter 62R is disposed on reception path BR that connects reception low noise amplifier 21 and antenna connection terminal 100. Reception filter 62R passes a reception signal in a reception band of communication band B, among the reception signals that have been input from antenna connection terminal 100. Reception filter 63R is disposed on reception path CR that connects reception low noise amplifier 22 and antenna connection terminal 100. Reception filter 63R passes a reception signal in a reception band of communication band C, among the reception signals that have been input from antenna connection terminal 100. Reception filter 64R is disposed on reception path DR that connects reception low noise amplifier 22 and antenna connection terminal 100. Reception filter 64R passes a reception signal in a reception band of communication band D, among the reception signals that have been input from antenna connection terminal 100.

Transmission filter 61T and reception filter 61R are included in duplexer 61 that has, as a pass band, communication band A. Transmission filter 62T and reception filter 62R are included in duplexer 62 that has, as a pass band, communication band B. Transmission filter 63T and reception filter 63R are included in duplexer 63 that has, as a pass band, communication band C. Transmission filter 64T and reception filter 64R are included in duplexer 64 that has, as a pass band, communication band D.

Transmission output matching circuit 30 includes matching circuits 31 and 32. Matching circuit 31 is disposed on a transmission output path that connects transmission power amplifier 11 and transmission filters 61T and 62T. Matching circuit 31 matches the impedance of transmission power amplifier 11 with the impedance of transmission filters 61T and 62T. Matching circuit 32 is disposed on a transmission path that connects transmission power amplifier 12 and transmission filters 63T and 64T. Matching circuit 32 matches the impedance of transmission power amplifier 12 with the impedance of transmission filters 63T and 64T.

Reception input matching circuit 40 includes matching circuits 41 and 42. Matching circuit 41 is disposed on a reception path that connects reception low noise amplifier 21 and reception filters 61R and 62R. Matching circuit 41 matches the impedance of reception low noise amplifier 21 with the impedance of reception filters 61R and 62R. Matching circuit 42 is disposed on a reception path that connects reception low noise amplifier 22 and reception filters 63R and 64R. Matching circuit 42 matches the impedance of reception low noise amplifier 22 with the impedance of reception filters 63R and 64R.

Switch 56 is one example of a first switch, and includes a common terminal and two selection terminals. The common terminal of switch 56 is connected to transmission input terminal 110. One of the selection terminals of switch 56 is connected to an input terminal of transmission power amplifier 11 via transmission input path ABT, and the other of the selection terminals of switch 56 is connected to an input terminal of transmission power amplifier 12 via transmission input path CDT. In this connection configuration, switch 56 switches between connecting the common terminal to one of the selection terminals and connecting the common terminal to the other of the selection terminals. In other words, switch 56 is disposed on transmission input paths ABT and CDT that connect transmission input terminal 110 and transmission power amplifiers 11 and 12. Switch 56 switches between connecting transmission input terminal 110 to transmission power amplifier 11 and connecting transmission input terminal 110 to transmission power amplifier 12. Switch 56 includes, for example, a single pole double throw (SPDT) switching circuit. It should be noted that switch 56 may be a multiple-connection switching circuit capable of simultaneously connecting the common terminal to one of the selection terminals and connecting the common terminal to the other of the selection terminals.

Switch 51 is one example of a second switch, and includes a common terminal and two selection terminals. The common terminal of switch 51 is connected to the output terminal of transmission power amplifier 11 via matching circuit 31. One of the selection terminals of switch 51 is connected to transmission filter 61T via transmission output path AT, and the other of the selection terminals of switch 51 is connected to transmission filter 62T via transmission output path BT. In this connection configuration, switch 51 switches between connecting the common terminal to one of the selection terminals and connecting the common terminal to the other of the selection terminals. In other words, switch 51 switches between (i) connecting transmission power amplifier 11 to transmission output path AT which is located between transmission power amplifier 11 and antenna connection terminal 100, and through which a transmission signal of communication band A is transferred and (ii) connecting transmission power amplifier 11 to transmission output path BT which is located between transmission power amplifier 11 and antenna connection terminal 100, and through which a transmission signal of communication band B is transferred. Switch 51 includes, for example, a single pole double throw (SPDT) switching circuit.

Switch 52 is one example of the second switch, and includes a common terminal and two selection terminals. The common terminal of switch 52 is connected to the output terminal of transmission power amplifier 12 via matching circuit 32. One of the selection terminals of switch 52 is connected to transmission filter 63T via transmission output path CT, and the other of the selection terminals of switch 52 is connected to transmission filter 64T via transmission output path DT. In this connection configuration, switch 52 switches between connecting the common terminal to one of the selection terminals and connecting the common terminal to the other of the selection terminals. In other words, switch 52 switches between (i) connecting transmission power amplifier 12 to transmission output path CT which is located between transmission power amplifier 12 and antenna connection terminal 100, and through which a transmission signal of communication band C is transferred and (ii) connecting transmission power amplifier 12 to transmission output path DT which is located between transmission power amplifier 12 and antenna connection terminal 100, and through which a transmission signal of communication band D is transferred.

Switch 53 includes a common terminal and two selection terminals. The common terminal of switch 53 is connected to an input terminal of reception low noise amplifier 21 via matching circuit 41. One of the selection terminals of switch 53 is connected to reception filter 61R disposed on reception path AR, and the other of the selection terminals of switch 53 is connected to reception filter 62R disposed on reception path BR. In this connection configuration, switch 53 switches between connecting the common terminal to one of the selection terminals and connecting the common terminal to the other of the selection terminals. In other words, switch 53 switches between connecting reception low noise amplifier 21 to reception path AR and connecting reception low noise amplifier 21 to reception path BR. Switch 53 includes, for example, an SPDT switching circuit.

Switch 54 includes a common terminal and two selection terminals. The common terminal of switch 54 is connected to an input terminal of reception low noise amplifier 22 via matching circuit 42. One of the selection terminals of switch 54 is connected to reception filter 63R disposed on reception path CR, and the other of the selection terminals of switch 54 is connected to reception filter 64R disposed on reception path DR. In this connection configuration, switch 54 switches between connecting the common terminal to one of the selection terminals and connecting the common terminal to the other of the selection terminals. In other words, switch 54 switches between connecting reception low noise amplifier 22 to reception path CR and connecting reception low noise amplifier 22 to reception path DR. Switch 54 includes, for example, an SPDT switching circuit.

Switch 55 is one example of an antenna switch, and is connected to antenna connection terminal 100 via diplexer 60. Switch 55 switches between (1) connecting antenna connection terminal 100 to transmission output path AT and reception path AR, (2) connecting antenna connection terminal 100 to transmission output path BT and reception path BR, (3) connecting antenna connection terminal 100 to transmission output path CT and reception path CR, and (4) connecting antenna connection terminal 100 to transmission output path DT and reception path DR. It should be noted that switch 55 includes a multiple-connection switching circuit capable of simultaneously connecting two or more of the above-described combinations (1) to (4).

Matching circuit 71 is disposed on a path that connects switch 55 and duplexer 61. Matching circuit 71 matches the impedance of antenna 2 and switch 55 with the impedance of duplexer 61. Matching circuit 72 is disposed on a path that connects switch 55 and duplexer 62. Matching circuit 72 matches the impedance of antenna 2 and switch 55 with the impedance of duplexer 62. Matching circuit 73 is disposed on a path that connects switch 55 and duplexer 63. Matching circuit 73 matches the impedance of antenna 2 and switch 55 with the impedance of duplexer 63. Matching circuit 74 is disposed on a path that connects switch 55 and duplexer 64. Matching circuit matches the impedance of antenna 2 and switch 55 with the impedance of duplexer 64.

Diplexer 60 is one example of a multiplexer, and includes filters 60L and 60H. Filter 60L is a filter which has, as a passband, a frequency range including the first frequency band group and the second frequency band group. Filter 60H is a filter which has, as a passband, a frequency range including another frequency band group that is different from the first frequency band group and the second frequency band group. One terminal of filter 60L and one terminal of filter 60H are commonly connected to antenna connection terminal 100. It should be noted that, when the first frequency band group and the second frequency band group are lower than the above-described other frequency band group, filter 60L may be a low-pass filter and filter 60H may be a high-pass filter.

It should be noted that the above-described transmission filters 61T to 64T, reception filters 61R to 64R, and filters 60L and 60H may be, for example, one of an acoustic wave filter using a surface acoustic wave (SAW), an acoustic wave filter using a bulk acoustic wave (BAW), an LC resonant filter, and a dielectric filter, but not limited to these filters.

Transmission power amplifiers 11 and 12 and reception low noise amplifiers 21 to 22 include, for example, a field-effect transistor (FET), a hetero-junction bipolar transistor (HBT), etc. which include a Si complementary metal oxide semiconductor (CMOS) or GaAs as a material.

In addition, reception low noise amplifiers 21 and 22, and switches 53, 54, and 55 may be included in a single semiconductor integrated circuit (IC). Furthermore, the above-described semiconductor IC may further include transmission power amplifiers 11 and 12, and switches 51, 52, and 56. The semiconductor IC includes a CMOS, for example. More specifically, the semiconductor IC is formed by a silicon on insulator (SOI) process. This allows manufacturing the semiconductor ICs at low cost. It should be noted that the semiconductor IC may include at least one of GaAs, SiGe, or GaN. With this, it is possible to output a radio frequency signal having a high-quality amplification performance and noise performance.

In the configuration of radio frequency module 1 described above, switch 56, transmission power amplifier 11, matching circuit 31, switch 51, transmission filter 61T, matching circuit 71, switch 55, and filter 60L are included in a first transmission circuit that transfers a transmission signal of communication band A toward antenna connection terminal 100. In addition, filter 60L, switch 55, matching circuit 71, reception filter 61R, switch 53, matching circuit 41, and reception low noise amplifier 21 are included in a first reception circuit that transfers a reception signal of communication band A from antenna 2 via antenna connection terminal 100.

In addition, switch 56, transmission power amplifier 11, matching circuit 31, switch 51, transmission filter 62T, matching circuit 72, switch 55, and filter 60L are included in a second transmission circuit that transfers a transmission signal of communication band B toward antenna connection terminal 100. In addition, filter 60L, switch 55, matching circuit 72, reception filter 62R, switch 53, matching circuit 41, and reception low noise amplifier 21 are included in a second reception circuit that transfers a reception signal of communication band B from antenna 2 via antenna connection terminal 100.

In addition, switch 56, transmission power amplifier 12, matching circuit 32, switch 52, transmission filter 63T, matching circuit 73, switch 55, and filter 60L are included in a third transmission circuit that transfers a transmission signal of communication band C toward antenna connection terminal 100. In addition, filter 60L, switch 55, matching circuit 73, reception filter 63R, switch 54, matching circuit 42, and reception low noise amplifier 22 are included in a third reception circuit that transfers a reception signal of communication band C from antenna 2 via antenna connection terminal 100.

In addition, switch 56, transmission power amplifier 12, matching circuit 32, switch 52, transmission filter 64T, matching circuit 74, switch 55, and filter 60L are included in a fourth transmission circuit that transfers a transmission signal of communication band D toward antenna connection terminal 100. In addition, filter 60L, switch 55, matching circuit 74, reception filter 64R, switch 54, matching circuit 42, and reception low noise amplifier 22 are included in a fourth reception circuit that transfers a reception signal of communication band D from antenna 2 via antenna connection terminal 100.

With the above-described circuit configuration, radio frequency module 1 is capable of performing at least one of simultaneously transmitting, simultaneously receiving, or simultaneously transmitting and receiving a radio frequency signal of either communication band A or communication band B and a radio frequency signal of either communication band C or communication band D.

It should be noted that, the radio frequency module according to the present disclosure may be implemented without connecting the above-described four transmission circuits and the above-described four reception circuits to antenna connection terminal 100 via switch 55, and the above-described four transmission circuits and the above-described four reception circuits may be connected to antenna 2 via different terminals. Furthermore, it is sufficient if the radio frequency module according to the present disclosure includes at least the first transmission circuit.

In addition, in the radio frequency module according to the present disclosure, it is sufficient if the first transmission circuit includes transmission power amplifier 11, switch 56, and at least one of circuit components disposed on transmission output path AT.

Here, when each of the circuit elements included in the above-described radio frequency module 1 is mounted on a single module board as a small-sized front-end circuit, it is necessary to reduce the layout area for the circuit components on the surface of the module board. In such a case, for example, it is expected that electric field coupling, magnetic field coupling, or electromagnetic field coupling occurs between a radio frequency component (e.g., switch 56) disposed on the input side of transmission power amplifiers 11 and 12 and a radio frequency component disposed on the output side of transmission power amplifiers 11 and 12. In this case, it is expected that transmission power amplifiers 11 and 12 oscillate as a result of formation of an unnecessary feedback loop that transfers a radio frequency signal between the input and output of transmission power amplifier 11 and the input and output of transmission power amplifier 12, and there arises a problem that the operation of transmission power amplifiers 11 and 12 become unstable.

In contrast, radio frequency module 1 according to the present embodiment has a configuration that reduces electric field coupling, magnetic field coupling, or electromagnetic field coupling between the circuit components disposed on the input side of transmission power amplifiers 11 and 12 and the circuit components disposed on the output side of transmission power amplifiers 11 and 12. The following describes the configuration of radio frequency module 1 according to the present embodiment that reduces electric field coupling, the magnetic field coupling, or the electromagnetic field coupling.

Figure 2A:
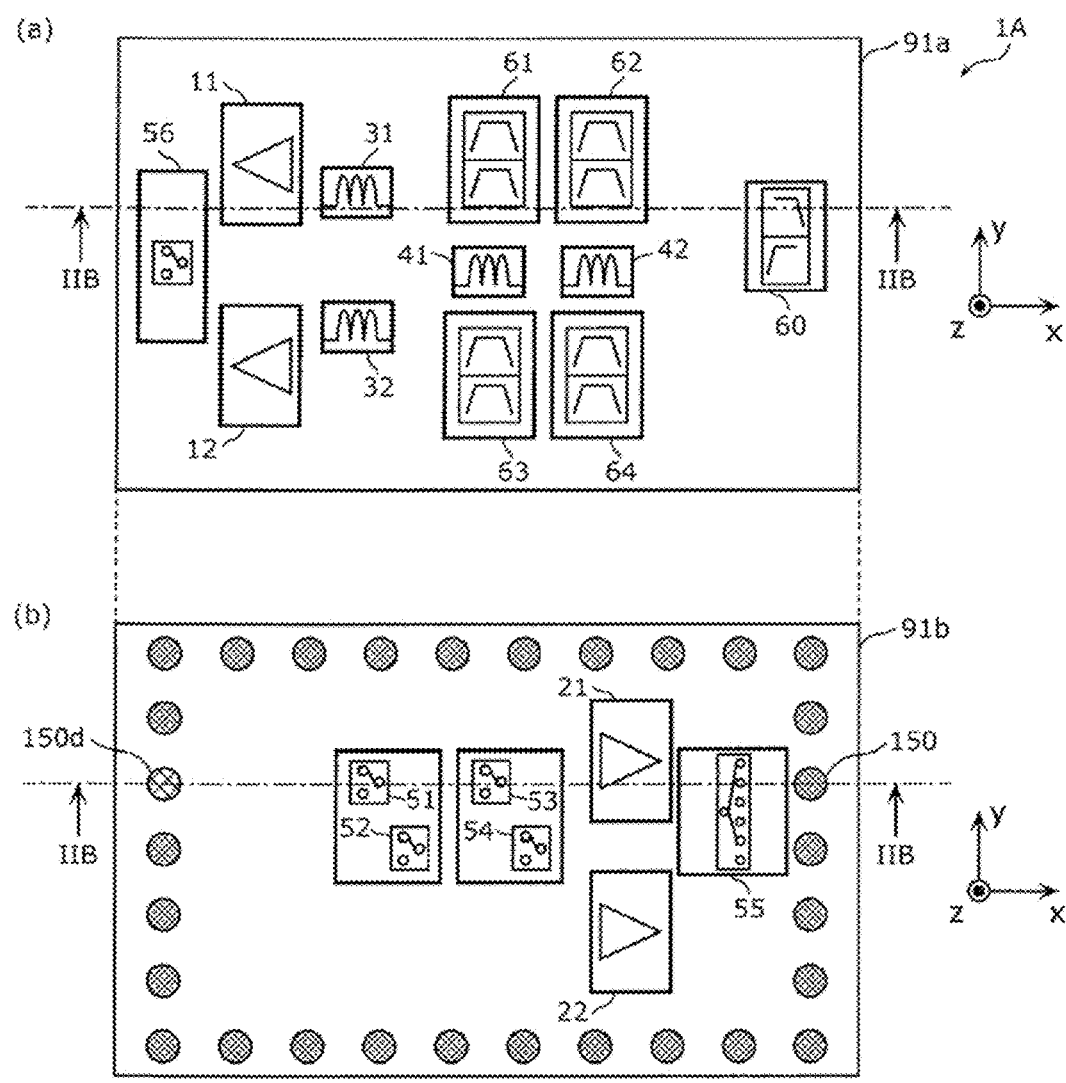
FIG. 2A is a schematic diagram illustrating a plan view configuration of the radio frequency module according to a working example.
Figure 2B:
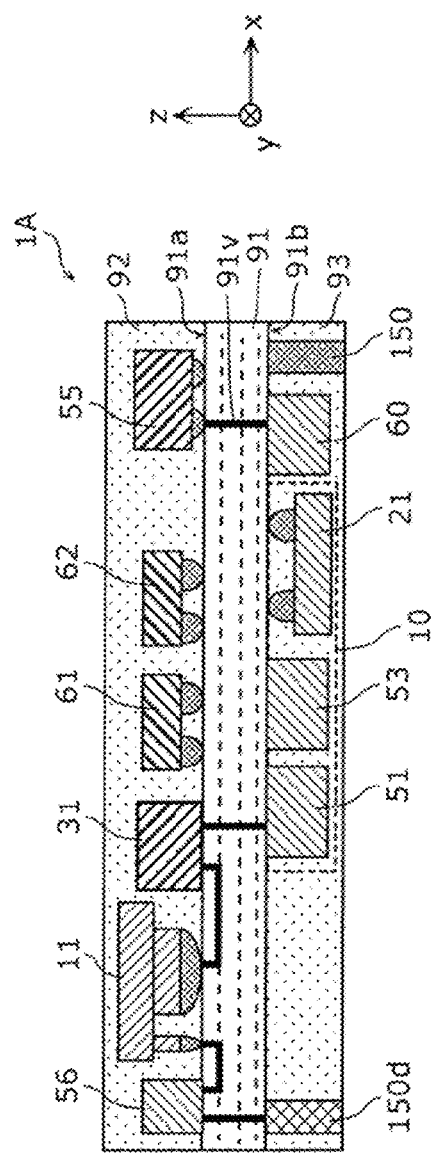
FIG. 2B is a schematic diagram illustrating a cross-sectional configuration of the radio frequency module according to the working example.

2. Arrangement Configuration of Circuit Elements of Radio Frequency Module 1A According to a Working Example FIG. 2A is a schematic diagram illustrating a plan view configuration of radio frequency module 1A according to a working example. FIG. 2B is a schematic diagram illustrating a cross-sectional configuration of radio frequency module 1A according to the working example. More specifically, FIG. 2B is a cross-sectional view taken along line IIB-IIB of FIG. 2A. It should be noted that (a) in FIG. 2A illustrates a layout of the circuit elements when, of principal surfaces 91a and 91b on opposite sides of module board 91, principal surface 91a is viewed from the z-axis positive side. In addition, (b) in FIG. 2A illustrates a perspective view of the layout of the circuit elements when principal surface 91b is viewed from the z-axis positive side.

In radio frequency module 1A according to the working example, the arrangement configuration of the respective circuit elements included in radio frequency module 1 according to the embodiment is specifically illustrated.

As illustrated in FIG. 2A and FIG. 2B, radio frequency module 1A according to the present working example includes module board 91 and resin components 92 and 93 in addition to the circuit configuration illustrated in FIG. 1.

Module board 91 is a board which includes principal surface 91a (a first principal surface) and principal surface 91b (a second principal surface) on opposite sides thereof, and on which the above-described transmission circuit and the above-described reception circuit are mounted. As module board 91, for example, a low temperature co-fired ceramic (LTCC) board having a stacked structure including a plurality of dielectric layers, a high temperature co-fired ceramic (HTCC) board, a component built-in board, a board including a redistribution layer (RDL), or a printed board or the like is used.

Resin component 92 is disposed on principal surface 91a of module board 91 and covers a portion of the above-described transmission circuit, a portion of the above-described reception circuit, and principal surface 91a of module board 91. Resin component 92 has a function of ensuring reliability such as mechanical strength and moisture resistance of the circuit elements included in the above-described transmission circuit and the above-described reception circuit. Resin component 93 is disposed on principal surface 91b of module board 91 and covers a portion of the above-described transmission circuit, a portion of the above-described reception circuit, and principal surface 91b of module board 91. Resin component 93 has a function of ensuring reliability such as mechanical strength and moisture resistance of the circuit elements included in the above-described transmission circuit and the above-described reception circuit. It should be noted that resin components 92 and 93 are not indispensable components for the radio frequency module according to the present disclosure.

As illustrated in FIG. 2A and FIG. 2B, in radio frequency module 1A according to the present working example, transmission power amplifiers 11 and 12, duplexers 61 to 64, switch 56, matching circuits 31, 32, 41, and 42, and diplexer 60 are surface-mounted on principal surface 91a of module board 91. Reception low noise amplifiers 21 and 22, and switches 51, 52, 53, 54, and 55 are surface-mounted on principal surface 91b of module board 91. In addition, although not illustrated in FIG. 2A or FIG. 2B, matching circuits 71 to 74 may be surface-mounted on any of principal surfaces 91a or 91b of module board 91, or may be built-in in module board 91.

In the present working example, switch 56 is a first circuit component disposed on transmission input paths ABT and CDT, and mounted on principal surface 91a. Switches 51, 52, and 55 are second circuit components disposed on transmission output paths AT to DT, and mounted on principal surface 91b.

According to the above-described configuration, the first circuit component disposed on transmission input paths ABT and CDT is disposed on principal surface 91a of module board 91, and the second circuit components disposed on the transmission output paths AT to DT are dispose on principal surface 91b. In other words, the first circuit component and the second circuit components are arranged with module board 91 interposed therebetween. With this configuration, it is possible to reduce electric field coupling, magnetic field coupling, or electromagnetic field coupling between the first circuit component disposed on the input side of transmission power amplifiers 11 and 12 and the second circuit components disposed on the output side of transmission power amplifiers 11 and 12. For that reason, it is possible to inhibit transmission power amplifiers 11 and 12 from oscillating as a result of formation of an unnecessary feedback loop that transfers a radio frequency signal between the input and output of transmission power amplifier 11 and the input and output of transmission power amplifier 12. It is thus possible to reduce an unstable operation of transmission power amplifiers 11 and 12.

It should be noted that, although radio frequency module 1A according to the present working example has a configuration in which switch 56 is mounted on principal surface 91a and switches 51, 52, and 55 are mounted on principal surface 91b, the present disclosure is not limited to this example.

It is sufficient if the radio frequency module according to the present disclosure includes the first circuit component mounted on principal surface 91a and at least one of the circuit components listed below (the second circuit components) is mounted on principal surface 91b. That is, it is sufficient if at least one of the following (1) to (6) is mounted on principal surface 91b as the second circuit component:

(1) matching circuit 31, 32, 71, 72, 73, or 74;
(2) switch 51 or 52;
(3) any one of transmission filters 61T to 64T or any one of duplexers 61 to 64;
(4) diplexer 60; or
(6) switch 55.

According to this configuration, compared to a radio frequency module having a configuration in which the first circuit component and the second circuit component of the above-described (1) to (6) are disposed on the same principal surface, it is possible to inhibit transmission power amplifiers 11 and 12 from oscillating as a result of formation of an unnecessary feedback loop that transfers a radio frequency signal between the input and output of transmission power amplifier 11 and the input and output of transmission power amplifier 12. It is thus possible to reduce an unstable operation of transmission power amplifiers 11 and 12.

It is desirable that module board 91 have a multilayer structure in which a plurality of dielectric layers are stacked, and that at least one of the plurality of dielectric layers include a ground electrode pattern formed thereon. With this configuration, the electromagnetic field shielding function of module board 91 is further improved.

In addition, in particular, it is desirable that switch 56 be the first circuit component and switch 51 or 52 be the second circuit component.

With this configuration, it is possible to reduce electric field coupling, magnetic field coupling, or electromagnetic field coupling between switch 56 located closest to the input terminal of transmission power amplifiers 11 and 12 and switch 51 or 52 located closest to the output terminal of transmission power amplifiers 11 and 12. For that reason, it is possible to most effectively inhibit transmission power amplifiers 11 and 12 from oscillating as a result of formation of an unnecessary feedback loop that transfers a radio frequency signal between the input and output of transmission power amplifier 11 and the input and output of transmission power amplifier 12. It is thus possible to effectively reduce an unstable operation of transmission power amplifiers 11 and 12.

In addition, as illustrated in FIG. 2A, it is desirable that switch 56 and switch 51 or 52 do not overlap in a plan view of module board.

With this configuration, not only switch 56 and switch 51 or 52 are arranged with module board 91 interposed therebetween, but also it is possible to ensure a large distance between switch 56 and switch 51 or 52. As a result, the isolation between the transmission input path and the transmission output path of transmission power amplifiers 11 and 12 is further improved. It is thus possible to further reduce an unstable operation of transmission power amplifiers 11 and 12.

In addition, in particular, it is desirable that switch 56 be the first circuit component and switch 55 be the second circuit component.

With this, it is possible to reduce electric field coupling, magnetic field coupling, or electromagnetic field coupling between switch 56 and switch 55 when a transmission signal of any of communication bands A to D is transferred through any of transmission paths AT to DT. Accordingly, it is possible to inhibit a transmission signal or a harmonic of the transmission signal of any of communication bands A to D from flowing into any of reception paths AR to DR without passing through one or more of the circuit components on the transmission path and decreasing reception sensitivity. In addition, it is possible to reduce the deterioration of the signal quality of a transmission signal output from radio frequency module 1A which is caused when a harmonic of a high-output transmission signal that is transferred through any of transmission output paths AT to DT is superimposed on the high-output transmission signal.

In addition, as illustrated in FIG. 2A, it is desirable that switch 56 and switch 55 do not overlap in a plan view of module board.

With this configuration, not only switch 56 and switch 55 are arranged with module board 91 interposed therebetween, but also it is possible to ensure a large distance between switch 56 and switch 55. As a result, it is possible to further reduce a decrease in the reception sensitivity in the reception path and deterioration of the signal quality of a transmission signal that is output from radio frequency module 1A.

It is desirable that module board 91 have a multilayer structure in which a plurality of dielectric layers are stacked, and that at least one of the plurality of dielectric layers include a ground electrode pattern formed thereon. With this configuration, the electromagnetic field shielding function of module board 91 is improved.

In addition, in radio frequency module 1A according to the present working example, a plurality of external-connection terminals 150 are disposed on principal surface 91b of module board 91. Radio frequency module 1A exchanges electrical signals with a motherboard disposed on the z-axis negative side of radio frequency module 1A via the plurality of external-connection terminals 150. In addition, one or some of the plurality of external-connection terminals 150 are set to the ground potential of the motherboard. Of principal surfaces 91a and 91b, transmission power amplifiers 11 and 12 which are difficult to reduce the height are not disposed on principal surface 91b that faces the motherboard, but reception low noise amplifiers 21 and 22 and switches 51 to 55 which are easy to reduce the height are disposed on principal surface 91b, and thus it is possible to reduce the height of radio frequency module 1A as a whole. In addition, a plurality of external-connection terminals 150 that are applied as ground electrodes are disposed in the vicinity of reception low noise amplifiers 21 and 22 that significantly affect the reception sensitivity of the reception circuits. As a result, it is possible to reduce the deterioration of reception sensitivity of the reception circuits.

It should be noted that external-connection terminals 150 may be columnar electrodes that penetrate through resin component 93 in the z-axis direction as illustrated in FIG. 2A and FIG. 2B, or bump electrodes formed on principal surface 91b.

In addition, in radio frequency module 1A according to the present working example, transmission power amplifiers 11 and 12 are mounted on principal surface 91a.

Transmission power amplifiers 11 and 12 are components that generate a large amount of heat among the circuit components included in radio frequency module 1A. In order to improve the heat dissipation property of radio frequency module 1A, it is important to dissipate heat generated by transmission power amplifiers 11 and 12 to the motherboard through a heat dissipation path having a small thermal resistance. If transmission power amplifiers 11 and 12 are mounted on principal surface 91b, the electrode lines connected to transmission power amplifiers 11 and 12 are arranged on principal surface 91b. For that reason, as the heat dissipation path, a heat dissipation path that passes though only a planar line pattern (along the xy plane direction) on principal surface 91b is included. The above-described planar line pattern is formed using a metal thin film, and thus has a large thermal resistance. For that reason, when transmission power amplifiers 11 and 12 are disposed on principal surface 91b, the heat dissipation property is decreased.

In contrast, when transmission power amplifiers 11 and 12 are mounted on principal surface 91a, it is possible to connect transmission power amplifiers 11 and 12 to external-connection terminals 150 through penetrating electrodes that penetrate through module board 91 between principal surface 91a and principal surface 91b. As a result, it is possible to exclude a heat dissipation path that passes through only the planar line pattern along the xy plane direction which has a large thermal resistance, from among the lines in module board 91 as the heat dissipation paths for transmission power amplifiers 11 and 12. It is thus possible to provide radio frequency module 1A having an improved heat dissipation property for dissipating heat from transmission power amplifiers 11 and 12 to the motherboard.

In addition, in a plan view of module board 91, it is desirable that switches 53 and 54 mounted on principal surface 91b and transmission power amplifiers 11 and 12 mounted on principal surface 91a do not overlap.

With this configuration, not only switches 53 and 54 disposed on the reception path and transmission power amplifiers 11 and 12 are arranged with module board 91 interposed therebetween, but also it is possible to ensure a large distance between switches 53 and 54 and transmission power amplifiers 11 and 12. As a result, the isolation between the transmission circuit and the reception circuit is further improved, and thus it is possible to inhibit a transmission signal, a harmonic, and a spurious wave of intermodulation distortion from flowing into the reception path to decrease the reception sensitivity.

In addition, as illustrated in radio frequency module 1A according to the present working example, it is desirable that an inductor of matching circuit 41 mounted on principal surface 91a and switch 53 mounted on principal surface 91b overlap in a plan view of module board 91. With this configuration, since the inductor of matching circuit 41 and switch 53 face each other across module board 91, it is possible to reduce the length of a line connecting the inductor of matching circuit 41 and switch 53. In addition, it is desirable that an inductor of matching circuit 42 mounted on principal surface 91a and switch 54 mounted on principal surface 91b overlap in a plan view of module board 91. With this configuration, since the inductor of matching circuit 42 and switch 54 face each other across module board 91, it is possible to reduce the length of a line connecting the inductor of matching circuit 42 and switch 54. As a result, it is possible to reduce transfer loss in the reception path.

In addition, as illustrated in radio frequency module 1A according to the present working example, it is desirable that at least one of duplexer 61 (or reception filter 61R) or duplexer 62 (or reception filter 62R) mounted on principal surface 91a and switch 53 mounted on principal surface 91b overlap in a plan view of module board 91. With this configuration, at least one of duplexer 61 or duplexer 62 and switch 53 face each other across module board 91, and thus it is possible to reduce the length of a line connecting at least one of duplexer 61 or duplexer 62 and switch 53. In addition, it is desirable that at least one of duplexer 63 (or reception filter 63R) or duplexer 64 (or reception filter 64R) mounted on principal surface 91a and switch 54 mounted on principal surface 91b overlap in a plan view of module board 91. With this configuration, at least one of duplexer 63 or duplexer 64 and switch 54 face each other across module board 91, and thus it is possible to reduce the length of a line connecting at least one of duplexer 63 or duplexer 64 and switch 54. As a result, it is possible to reduce transfer loss in the reception path.

Furthermore, in radio frequency module 1A according to the present working example, diplexer 60 and switch 55 overlap in a plan view of module board 91. According to the present working example, switch 55 and diplexer 60 are connected by via conductor 91v that penetrates through module board 91 between principal surface 91a and principal surface 91b.

With this configuration, diplexer 60 and switch 55 face each other across module board 91, and thus it is possible to reduce the length of a line connecting diplexer 60 and switch 55. As a result, it is possible to reduce transfer loss in both the transmission path and the reception path of radio frequency module 1A.

It should be noted that reception low noise amplifiers 21 and 22 and switches 53, 54, and 55 may be built in single semiconductor IC 10. With this configuration, it possible to reduce the height on principal surface 91b side in the z-axis direction, and also reduce the component mounting area of principal surface 91b. As a result, it is possible to downsize radio frequency module 1A. In addition, semiconductor IC 10 may include switches 51 and 52.

4. Advantageous Effects, Etc

As described above, radio frequency module 1 according to the present embodiment includes: module board 91 including principal surfaces 91a and 91b on opposite sides of module board 91; transmission input terminal 110; antenna connection terminal 100; and transmission power amplifier 11. At least one of one or more first circuit components that are disposed on transmission input path ABT connecting transmission input terminal 110 and the input terminal of transmission power amplifier 11 is mounted on principal surface 91a, and at least one of one or more second circuit components that are disposed on transmission output path AT or BT connecting the output terminal of transmission power amplifier 11 and antenna connection terminal 100 is mounted on principal surface 91b.

With this configuration, it is possible to reduce electric field coupling, magnetic field coupling, or electromagnetic field coupling between the at least one of one or more first circuit components disposed on the input side of transmission power amplifier 11 and the at least one of one or more second circuit components disposed on the output side of transmission power amplifier 11. For that reason, it is possible to inhibit transmission power amplifier 11 from oscillating as a result of formation of an unnecessary feedback loop that transfers a radio frequency signal between the input and output of transmission power amplifier 11. It is thus possible to reduce an unstable operation of transmission power amplifier 11.

In addition, the above-described at least one of the one or more first circuit components may be switch 56, and the above-described at least one of the one or more second circuit components may be switch 51.

With this configuration, it is possible to reduce electric field coupling, magnetic field coupling, or electromagnetic field coupling between switch 56 located closest to the input terminal of transmission power amplifier 11 and switch 51 located closest to the output terminal of transmission power amplifier 11. For that reason, it is possible to most effectively inhibit transmission power amplifier 11 from oscillating as a result of formation of an unnecessary feedback loop that transfers a radio frequency signal between the input and output of transmission power amplifier 11. It is thus possible to effectively reduce an unstable operation of transmission power amplifier 11.

In addition, it is desirable that switch 56 and switch 51 do not overlap in a plan view of module board 91.

With this configuration, not only switch 56 and switch 51 are arranged with module board 91 interposed therebetween, but also it is possible to ensure a large distance between switch 56 and switch 51. As a result, the isolation between the transmission input path and the transmission output path of transmission power amplifier 11 is further improved. It is thus possible to further reduce an unstable operation of transmission power amplifier 11.

In addition, the above-described at least one of the one or more first circuit components may be switch 56, and the above-described at least one of the one or more second circuit components may be switch 55.

With this configuration, it is possible to reduce electric field coupling, magnetic field coupling, or electromagnetic field coupling between switch 56 and switch 55 when a transmission signal of any of communication bands A to D is transferred through any of transmission output paths AT to DT. Accordingly, it is possible to inhibit a transmission signal or a harmonic of the transmission signal of any of communication bands A to D from flowing into any of reception paths AR to DR without passing through one or more of the circuit components on the transmission path and decreasing reception sensitivity. It is also possible to reduce the deterioration of the signal quality of a transmission signal output from radio frequency module 1 which is caused when a harmonic of a high-output transmission signal transferred through any of transmission output paths AT to DT superposes on the high-output transmission signal.

In addition, it is desirable that switch 56 and switch 55 do not overlap in a plan view of module board 91.

With this configuration, not only switch 56 and switch 55 are arranged with module board 91 interposed therebetween, but also it is possible to ensure a large distance between switch 56 and switch 55. As a result, it is possible to further reduce a decrease in the reception sensitivity in the reception path and deterioration of the signal quality of a transmission signal output from radio frequency module 1.

In addition, radio frequency module 1 according to the present embodiment may further include external-connection terminal 150, external-connection terminal 150 may be disposed on principal surface 91b, and transmission power amplifier 11 may be mounted on principal surface 91b.

As a result, it is possible to exclude a heat dissipation path that passes through only the planar line pattern which has a large thermal resistance, from among the lines in module board 91, as the heat dissipation paths for transmission power amplifier 11. It is thus possible to provide radio frequency module 1 having an improved heat dissipation property for dissipating heat from transmission power amplifier 11 to the motherboard.

In addition, communication device 5 includes RFIC 3 that processes a radio frequency signal to be transmitted by antenna 2 and a radio frequency signal received by antenna 2, and radio frequency module 1 that transfers the radio frequency signals between antenna 2 and RFIC 3.

It is thus possible to reduce an unstable operation of transmission power amplifier 11.

OTHER EMBODIMENTS, ETC

Although the radio frequency module and the communication device according to the embodiment of the present disclosure have been described above based on the embodiment and variations of the embodiment, the radio frequency module and the communication device according to the present disclosure are not limited to the foregoing embodiment and the variations of the embodiment. The present disclosure also encompasses other embodiments achieved by combining arbitrary structural components in the above-described embodiment and the variations of the embodiment, variations resulting from various modifications to the above-described embodiment and the variations of the embodiment that may be conceived by those skilled in the art without departing from the essence of the present disclosure, and various devices that include the above-described radio frequency module and the above-described communication device.

For example, in the radio frequency module and the communication device according to the foregoing embodiment and the variations of the embodiment, another circuit element and line, for example, may be inserted in a path connecting circuit elements and a signal path which are disclosed in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable widely in communication devices such as mobile phones as a radio frequency module disposed in a multiband-compatible front-end unit.

The invention claimed is:

1. A radio frequency module, comprising:
   a module board including a first principal surface and a second principal surface on opposite sides of the module board, the module board including, a transmission input terminal, and an antenna connection terminal;
   a transmission power amplifier disposed on the module board and connected to the transmission input terminal;
   one or more first circuit components disposed on a transmission input path that is a signal path connecting the transmission input terminal and an input terminal of the transmission power amplifier; and
   one or more second circuit components disposed on a transmission output path that is a signal path connecting an output terminal of the transmission power amplifier and the antenna connection terminal, wherein
   at least one of the one or more first circuit components is mounted on the first principal surface, and
   at least one of the one or more second circuit components includes a signal switch that controllable switches an amplified signal applied to the antenna connection terminal, wherein in a first state the signal switch applies a first amplified signal in a first communication band to the antenna connection terminal and in a second state applies a second amplified signal in a second communication band to the antenna connection terminal, the signal switch being mounted on the second principal surface.

2. The radio frequency module according to claim 1, wherein
   the at least one of the one or more first circuit components being a first switch disposed between the transmission input terminal and the transmission power amplifier, the first switch configured to controllably switch connection of the transmission input terminal to the transmission power amplifier and disconnection of the transmission input terminal from the transmission power amplifier, and
   the at least one of the one or more second circuit components being the signal switch disposed between the output terminal of the transmission power amplifier and a first transmission output path through which a transmission signal of the first communication band is transferred and between the output terminal of the transmission power amplifier and a second transmission output path through which a transmission signal of the second communication band is transferred, the first transmission output path and the second transmission output path being located between the transmission power amplifier and the antenna connection terminal, the signal switch configured to switch connection of the transmission power amplifier between the first transmission output path and the second transmission output path.

3. The radio frequency module according to claim 2, wherein
   the first switch and the signal switch do not overlap in a plan view of the module board.

4. The radio frequency module according to claim 1, wherein
   the at least one of the one or more first circuit components being a first switch disposed between the transmission input terminal and the transmission power amplifier, the first switch configured to controllably switch connection of the transmission input terminal to the transmission power amplifier and disconnection of the transmission input terminal from the transmission power amplifier, and the at least one of the one or more second circuit components being the signal switch configured to switch between (i) connection of the antenna connection terminal to a first transmission output path through which a transmission signal of the first communication band is transferred and (ii) connection of the antenna connection terminal to a second transmission output path through which a transmission signal of the second communication band is transferred, the first transmission output path and the second transmission output path being located between the transmission power amplifier and the antenna connection terminal.

5. The radio frequency module according to claim 4, wherein
the first switch and the signal switch do not overlap in a plan view of the module board.

6. The radio frequency module according to claim 2, further comprising:
an external-connection terminal, wherein
the external-connection terminal is disposed on the first principal surface, and
the transmission power amplifier is mounted on the second principal surface.

7. A communication device, comprising:
an antenna;
a radio frequency (RF) signal processing circuit configured to process a radio frequency signal to be transmitted by the antenna and a radio frequency signal received by the antenna; and
a radio frequency module configured to transfer the radio frequency signals between the antenna and the RF signal processing circuit, the radio frequency module including
a module board including a first principal surface and a second principal surface on opposite sides of the module board, the module board including, a transmission input terminal, and an antenna connection terminal
a transmission power amplifier disposed on the module board and connected to the transmission input terminal,
one or more first circuit components disposed on a transmission input path that is a signal path connecting the transmission input terminal and an input terminal of the transmission power amplifier, and
one or more second circuit components disposed on a transmission output path that is a signal path connecting an output terminal of the transmission power amplifier and the antenna connection terminal, wherein
at least one of the one or more first circuit components is mounted on the first principal surface, and
at least one of the one or more second circuit components includes a signal switch that controllable switches an amplified signal applied to the antenna connection terminal, in a first state the signal switch applies a first amplified signal in a first communication band to the antenna connection terminal and in a second state applies a second amplified signal in a second communication band to the antenna connection terminal, the signal switch being mounted on the second principal surface.

8. The communication device according to claim 7, wherein in the radio frequency module the at least one of the one or more first circuit components being a first switch disposed between the transmission input terminal and the transmission power amplifier, the first switch configured to controllably switch connection of the transmission input terminal to the transmission power amplifier and disconnection of the transmission input terminal from the transmission power amplifier, and the at least one of the one or more second circuit components being the signal switch disposed between the output terminal of the transmission power amplifier and a first transmission output path through which a transmission signal of the first communication band is transferred and between the output terminal of the transmission power amplifier and a second transmission output path through which a transmission signal of the second communication band is transferred, the first transmission output path and the second transmission output path being located between the transmission power amplifier and the antenna connection terminal, the signal switch configured to switch connection of the transmission power amplifier between the first transmission output path and the second transmission output path.

9. The communication device according to claim 8, wherein in the radio frequency module
the first switch and the signal switch do not overlap in a plan view of the module board.

10. The communication device according to claim 7, wherein in the radio frequency module the at least one of the one or more first circuit components being a first switch disposed between the transmission input terminal and the transmission power amplifier, the first switch configured to controllably switch connection of the transmission input terminal to the transmission power amplifier and disconnection of the transmission input terminal from the transmission power amplifier, and the at least one of the one or more second circuit components being the signal switch configured to switch between (i) connection of the antenna connection terminal to a first transmission output path through which a transmission signal of the first communication band is transferred and (ii) connection of the antenna connection terminal to a second transmission output path through which a transmission signal of the second communication band is transferred, the first transmission output path and the second transmission output path being located between the transmission power amplifier and the antenna connection terminal.

11. The communication device according to claim 10, wherein in the radio frequency module
the first switch and the signal switch do not overlap in a plan view of the module board.

12. The communication device according to claim 8, wherein the radio frequency module further comprising:
an external-connection terminal, wherein
the external-connection terminal is disposed on the first principal surface, and
the transmission power amplifier is mounted on the second principal surface.

* * * * *